(12) United States Patent
Julien et al.

(10) Patent No.: US 11,183,505 B2
(45) Date of Patent: Nov. 23, 2021

(54) PROCESS FOR FABRICATING MEDIUM-VOLTAGE TRANSISTORS AND CORRESPONDING INTEGRATED CIRCUIT

(71) Applicant: STMicroelectronics (Rousset) SAS, Rousset (FR)

(72) Inventors: Franck Julien, La Penne sur Huveaune (FR); Abderrezak Marzaki, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/939,603

(22) Filed: Jul. 27, 2020

(65) Prior Publication Data
US 2021/0035996 A1    Feb. 4, 2021

(30) Foreign Application Priority Data
Jul. 31, 2019    (FR) ...................................... 1908775

(51) Int. Cl.
| H01L 27/11531 | (2017.01) |
| H01L 27/11543 | (2017.01) |
| H01L 27/11546 | (2017.01) |
| H01L 29/66 | (2006.01) |
| H01L 29/788 | (2006.01) |
| H01L 21/28 | (2006.01) |
| H01L 21/02 | (2006.01) |
| H01L 21/265 | (2006.01) |
| H01L 21/311 | (2006.01) |
| H01L 27/11521 | (2017.01) |

(52) U.S. Cl.
CPC .. *H01L 27/11531* (2013.01); *H01L 21/02164* (2013.01); *H01L 21/26513* (2013.01); *H01L 21/31111* (2013.01); *H01L 27/11521* (2013.01); *H01L 29/40114* (2019.08); *H01L 29/66537* (2013.01); *H01L 29/66825* (2013.01); *H01L 29/7883* (2013.01)

(58) Field of Classification Search
CPC ......... H01L 27/11531; H01L 29/40114; H01L 21/02164; H01L 21/26513; H01L 21/31111; H01L 27/11521; H01L 29/66537; H01L 29/66825; H01L 29/7883; H01L 27/11543; H01L 27/11546
See application file for complete search history.

(56) References Cited

U.S. PATENT DOCUMENTS 7,139,195 B2 * 11/2006 Rosa .................. G11C 16/0441
                                                                    365/185.1
2001/0004120 A1    6/2001 Colclaser et al.

FOREIGN PATENT DOCUMENTS

JP          2936608 B2    6/1999

OTHER PUBLICATIONS

INPI Search Report and Written Opinion for FR 1908775 dated Apr. 14, 2020 (8 pages).

* cited by examiner

*Primary Examiner* — David Vu
(74) *Attorney, Agent, or Firm* — Crowe & Dunlevy

(57) ABSTRACT

A process for fabricating an integrated circuit includes the fabrication of a first transistor and a floating-gate transistor. The fabrication process for the first transistor and the floating-gate transistor utilizes a common step of forming a dielectric layer. This dielectric layer is configured to form a tunnel-dielectric layer of the floating-gate transistor (which allows transfer of charge via the Fowler-Nordheim effect) and to form a gate-dielectric layer of the first transistor.

20 Claims, 4 Drawing Sheets

|  | CMOS_HV | CMOS_TN | CMOS_TN_W | CMOS_IO |
|---|---|---|---|---|
| $I_{ON}$ (µA/µm) | 264 | 482 | 416 | 550 |
| VT(V) | 0.64 | 0.26 | 0.46 | 0.5 |
| Log ($I_{OFF}$) (A/µm) | -11.5 | -9.5 | -11.5 | -12.4 |
| VDD max (V) | 5.5 | ~4 | ~4 | 3.6 |
| AddCt | 0% | 0% | +1% | +3% |
FIG. 3
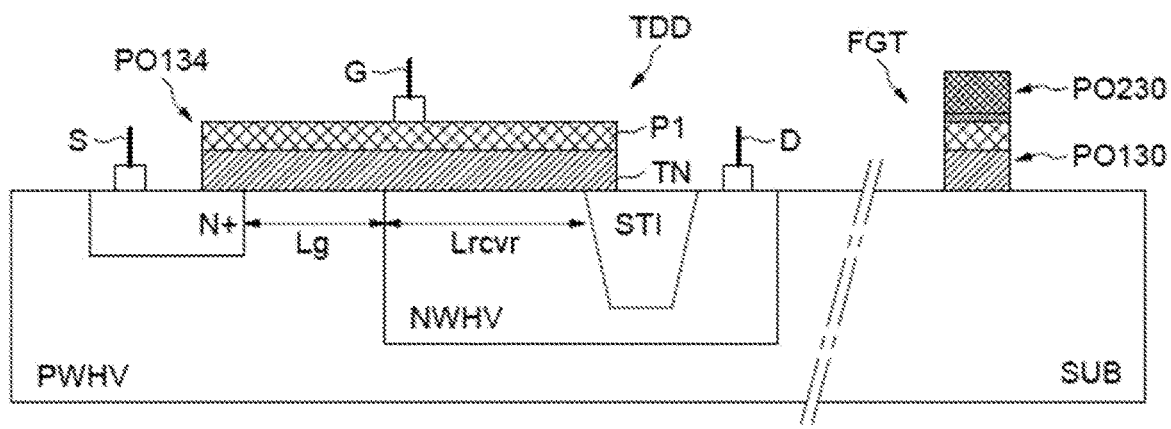
FIG. 4
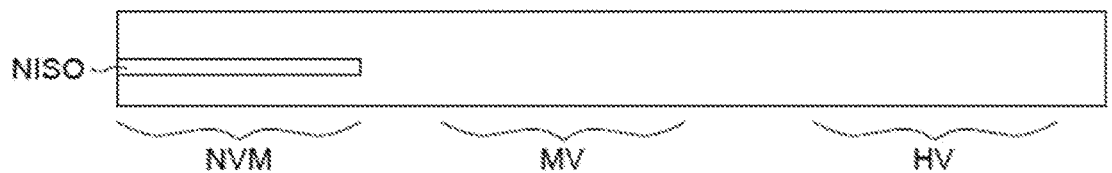
FIG. 5

PROCESS FOR FABRICATING MEDIUM-VOLTAGE TRANSISTORS AND CORRESPONDING INTEGRATED CIRCUIT

PRIORITY CLAIM

This application claims the priority benefit of French Application for Patent No. 1908775, filed on Jul. 31, 2019, the content of which is hereby incorporated by reference in its entirety to the maximum extent allowable by law.

TECHNICAL FIELD

Embodiments and implementations relate to the fabrication of medium-voltage CMOS transistors and to the corresponding integrated circuits.

BACKGROUND

More and more elements having different uses, in particular having different useful voltage ranges, may be incorporated into the same integrated circuit.

Medium-voltage devices are devices configured and intended to operate at voltages conventionally comprised between 1.8 V and 3.3 V, and/or between 4 V and 5 V.

For example, medium-voltage devices are found in signal input/output stages where the useful voltages are higher than the low voltages of the logic elements that operate on these signals. Low voltages are typically comprised between 0.8 V and 1.5 V.

FIG. 1 shows an example of conventional technologies used in elements having respective architectures each corresponding to a range of useful voltages.

Low-voltage transistors CMOS_LV comprise a gate region and a gate oxide, PO21, the gate oxide having a thickness comprised between 1 nm and 3 nm, for voltages of 0.8 V to 1.5 V.

First medium-voltage transistors CMOS_IO comprise a gate region and a gate oxide, PO22, the gate oxide having a thickness comprised between 7 nm and 8 nm, for voltages from 1.8 V to 3.3 V. Conventional techniques for fabricating such first medium-voltage transistors CMOS_IO may comprise four dedicated implanting steps, and one dedicated oxide formation.

Second medium-voltage transistors CMOS_5V comprise a gate region and a gate oxide, PO11, the gate oxide having a thickness comprised between 12 nm and 13 nm, for voltages from 4 V to 5 V.

High-voltage transistors CMOS_HV comprise a gate region and a gate oxide, PO12, the gate oxide having a thickness comprised between 15 nm and 16 nm, or even up to 25 nm, for voltages from 5 V to 11 V.

Moreover, floating-gate transistors FGT may be provided and comprise a floating-gate region and a tunnel oxide, PO13, the tunnel oxide having a thickness comprised between 7 nm and 10 nm, preferably between 8 nm and 9.5 nm, and for example of 8.7 nm, in order to allow transfer of charge via the Fowler-Nordheim effect at voltages higher than 10 V to the floating gate, said transistors being surmounted by a control-gate region and a control-gate dielectric, PO23.

Each type of transistor thus has a respective architecture that is different from one type to the next, in particular in terms of thickness of the gate-oxide layer, and dedicated processing steps are provided for each type of transistor.

Although certain steps may be partially mutualized, for example the depositions of the gate conductors, conventional processes are very expensive because of the dedicated steps.

It would be desirable to decrease the costs of processes for fabricating integrated circuits.

SUMMARY

In this respect, according to one aspect, a process for fabricating an integrated circuit is provided, this process comprising a fabrication of at least one first transistor configured to operate under a first supply voltage, for example comprised between 1.8 V and 5 V, and a fabrication of at least one floating-gate transistor, wherein said fabrications of the first transistor and of the floating-gate transistor comprise a common step of forming a dielectric layer, which is configured to form a tunnel-dielectric layer of the floating-gate transistor, which layer is intended to allow transfer of charge via the Fowler-Nordheim effect at second voltages higher than the first supply voltage, for example higher than 10 V, and to form a gate-dielectric layer of the first transistor.

According to one implementation, said fabrications of the first transistor and of the floating-gate transistor comprise a common step of forming gate regions, which is configured to form a floating-gate region of the floating-gate transistor and a gate region of the first transistor.

Thus, the fabrication of the medium-voltage transistors does not require a dedicated step, but on the contrary uses only steps already provided for in the fabrication of the floating-gate transistor. Specifically, the nature and the thickness of the tunnel-dielectric layer and the nature and the thickness of the floating-gate region of the floating-gate transistors may be suitable for fabrication of medium-voltage transistors, in particular transistors intended to be supplied with a voltage comprised between 1.8 V and 5 V.

Therefore, the process for fabricating the medium-voltage transistors is of zero cost and the overall cost of the integrated circuit is decreased.

Furthermore, the structure of the first transistor produced using this process allows, with respect to conventional technologies, a better electrostatic control, reduced channel pinch-off effects, a better conduction in saturated regime and/or lower leakage currents to be achieved.

According to one implementation, the process furthermore comprises a fabrication of at least one remote-drain transistor, wherein the common step of forming the dielectric layer is configured to form a gate-dielectric layer of the remote-drain transistor.

Advantageously, the common step of forming gate regions is configured to form a gate region of the remote-drain transistor.

Remote-drain transistors are conventionally configured to allow a medium-voltage control while nonetheless being able to withstand high voltages on their drains. The fabrication of remote-drain transistors conventionally introduces dedicated and expensive steps, in particular a formation of a dedicated oxide layer.

This implementation thus allows, at lower cost, production of remote-drain transistors to be integrated into processes that initially did not make provision for such transistors, or the cost of processes that did make provision for such transistors to be decreased.

According to one implementation, the common step of forming the dielectric layer comprises thermal growth of a silicon-oxide layer and an etch of the silicon-oxide layer to a thickness comprised between 7 nm and 10 nm, preferably between 8 nm and 9.5 nm, and for example of 8.7 nm.

Specifically, growth-based forming techniques lead to structures that are more robust than deposition-based forming techniques. Thus, the robustness of the medium-voltage transistors is improved and/or the range of applicable medium voltages is broadened with this implementation.

Moreover, the common step of forming gate regions may comprise a formation of a conductive polysilicon layer having a thickness comprised between 60 nm and 150 nm. The polysilicon may be optionally doped in situ.

According to one implementation, said fabrication of the first transistor comprises a formation of a semiconductor well comprising a step of implanting dopants in a concentration configured to adjust, to a desired value, the threshold voltage of the first transistor, the first transistor being fabricated on said well.

The dedicated implanting step of this implementation introduces an additional cost with respect to the process not comprising this dedicated step, but the overall cost is still lower than that of conventional techniques for forming medium-voltage transistors. Adjusting the threshold voltage of the first transistor is advantageous per se for control and compatibility reasons, and furthermore allows the leakage currents of the first transistors to be kept low.

According to another aspect, an integrated circuit is provided, this integrated circuit comprising at least one first transistor configured to operate under a first supply voltage, for example comprised between 1.8 V and 5 V, comprising a gate-dielectric layer, and at least one floating-gate transistor comprising a tunnel-dielectric layer configured to allow transfer of charge via the Fowler-Nordheim effect at second voltages higher than the first supply voltage, for example higher than 10 V, wherein the gate-dielectric layer of the first transistor has the same nature and has the same thickness as the tunnel-dielectric layer.

According to one embodiment in which the first transistor comprises a gate region and the floating-gate transistor comprises a floating-gate region, the gate region of the first transistor has the same nature and has the same thickness as the floating-gate region of the floating-gate transistor.

According to one embodiment in which the integrated circuit further comprises at least one remote-drain transistor comprising a dielectric layer and a gate region partially covering a drain region, the gate-dielectric layer of the remote-drain transistor has the same nature and has the same thickness as the tunnel-dielectric layer of the floating-gate transistor.

For example, the gate region of the remote-drain transistor has the same nature and has the same thickness as the floating-gate region of the floating-gate transistor.

According to one embodiment, the tunnel-dielectric layer is in nature a silicon oxide, of thickness comprised between 7 nm and 10 nm, preferably between 8 nm and 9.5 nm, and for example of 8.7 nm.

For example, the nature of the floating-gate region is that of conductive polysilicon, of thickness comprised between 60 nm and 150 nm.

According to one embodiment, the first transistor is formed on a semiconductor well doped to a concentration configured to adjust, to a desired value, the threshold voltage of the first transistor.

BRIEF DESCRIPTION OF THE DRAWINGS

Other advantages and features of the invention will become apparent on examining the detailed description of completely non-limiting implementations and embodiments, and the appended drawings, in which:

FIG. 3 shows a table of comparative examples of the performance of medium-voltage transistors with respect to the performance of conventionally produced medium-voltage transistors and high-voltage transistors;

FIG. 4 shows a transistor of the remote-drain type; and

FIGS. 5 to 14 shows respective steps of a process for fabricating an integrated circuit.

DETAILED DESCRIPTION

Figure 2:
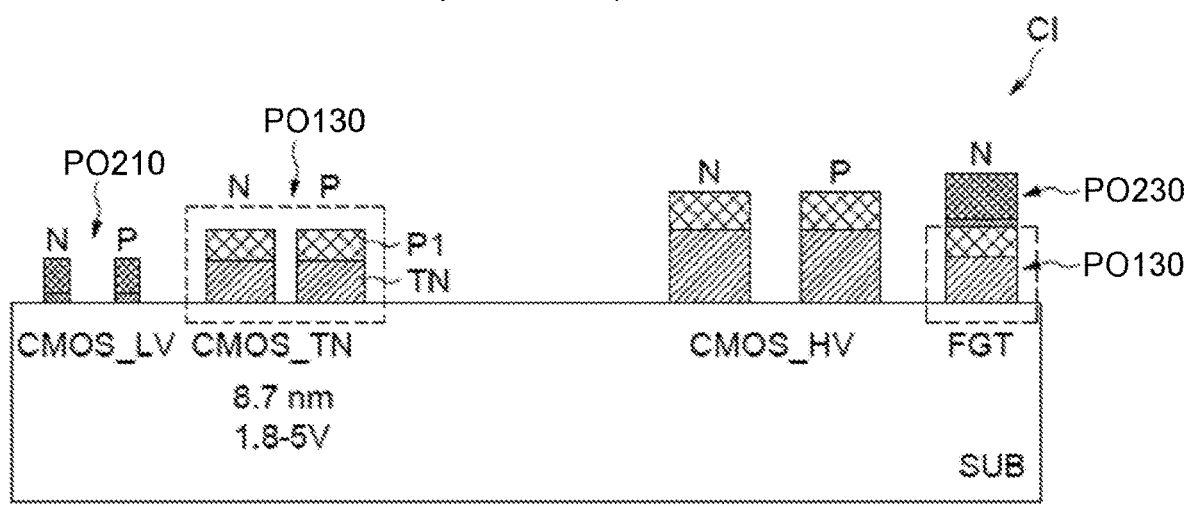
FIG. 2 shows an integrated circuit comprising transistors having an architecture that is advantageous for various voltage ranges.

FIG. 2 shows an integrated circuit CI comprising transistors having an architecture that is advantageous for various voltage ranges.

The integrated circuit CI comprises low-voltage transistors CMOS_LV comprising a gate structure PO210 including a gate region and a gate oxide, the gate oxide having a thickness comprised between 1 nm and 3 nm, for voltages from 0.8 V to 1.5 V.

The integrated circuit CI comprises high-voltage transistors CMOS_HV comprising a gate structure PO130 including a gate region and a gate oxide, the gate oxide having a thickness comprised between 15 nm and 16 nm, for voltages from 5 V to 11 V.

The integrated circuit CI comprises at least one first transistor CMOS_TN configured to operate under a supply voltage comprised between 1.8 V and 5 V. The first transistor is thus intended for a "medium-voltage" supply, of between 1.8 V and 5 V, and will be qualified a "medium-voltage transistor" below.

The medium-voltage transistor CMOS_TN comprises a gate structure PO130 comprising a gate region P1 and a gate-dielectric layer TN.

Moreover, the integrated circuit comprises at least one floating-gate transistor FGT comprising a control-gate structure PO230 superposed on a floating-gate structure PO130. The floating-gate structure PO130 comprises a floating-gate region P1 and a tunnel-dielectric layer TN. The tunnel-dielectric layer TN is specifically configured to allow transfer of charge via the Fowler-Nordheim effect at voltages higher than 10 V to the floating gate P1.

The gate-dielectric layer TN of the medium-voltage transistor CMOS_TN has the same nature (e.g., material) and has the same thickness as the tunnel-dielectric layer TN, and the gate region P1 of the medium-voltage transistor CMOS_TN has the same nature (e.g., material) and has the same thickness as the floating-gate region P1 of the floating-gate transistor FGT.

Specifically, as will be described with reference to FIGS. 5 to 14, the medium-voltage transistor CMOS_TN and the floating-gate transistor FGT are produced in particular as a result of a common step of forming the tunnel-dielectric layer TN of the floating-gate transistor FGT and the gate-dielectric layer TN of the medium-voltage transistor CMOS_TN, and of a common step of forming the floating-gate region P1 of the floating-gate transistor FGT and the gate region P1 of the medium-voltage transistor CMOS_TN.

For example, the tunnel-dielectric layer is in nature made of a silicon oxide material, and the thickness of the tunnel-dielectric layer is comprised between 7 nm and 10 nm, preferably between 8 nm and 9.5 nm, and is for example of 8.7 nm.

The nature of the floating-gate region is, for example, that of a material which is conductive doped polysilicon, having a thickness comprised between 60 nm and 150 nm.

According to one alternative that is advantageous in terms of performance, the medium-voltage transistor CMOS_TN is produced on a semiconductor well formed in a way dedicated to the production thereof. The semiconductor well comprises an implantation of dopants into a substrate, the dopants having a concentration configured to adjust, to a desired value, the threshold voltage of the medium-voltage transistor.

Figure 1:
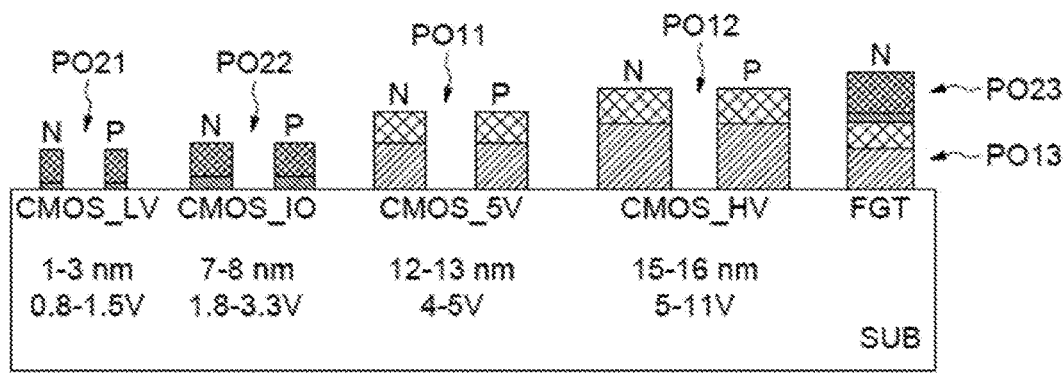
FIG. 1 shows an example of conventional technologies used in elements having respective architectures each corresponding to a range of useful voltages.

FIG. 3 shows a table of comparative examples of the performance of medium-voltage transistors CMOS_TN, CMOS_TN_W according to the invention, with respect to the performance of conventionally produced first medium-voltage transistors CMOS_IO and high-voltage transistors CMOS_HV, such as described above with reference to FIG. 1, and having the same structural characteristics (with the exception of the nature and thickness of the gate-dielectric layers).

The presented results correspond to embodiments of NMOS transistors. Embodiments of PMOS transistors have also been compared and give relative results that are similar to those of the NMOS transistors.

The results presented in the table of FIG. 3 are the result of preliminary experimental measurements and allow variations between the performance of the presented technologies to be identified. The presented results do not limit the possible performance of the described technologies, the latter of course being optimizable and improvable.

The performance of the transistors, the gate dielectrics of which are the same as the tunnel dielectric of the floating-gate transistors FGT, is presented, for the CMOS_TN alternative in which no dedicated well was implanted, and for the CMOS_TN_W alternative in which a dedicated well was formed.

Below, the conventional high-voltage and medium-voltage transistors will be referenced directly by their respective references CMOS_HV and CMOS_IO, and likewise the medium-voltage transistors according to the two alternatives will be referenced by their respective references CMOS_TN and CMOS_TN_W.

The conventional transistors CMOS_IO comprise a gate oxide having a thickness of 5 nm, and the conventional transistors CMOS_HV comprise a gate oxide having a thickness of 15 nm.

The current characteristics in saturated regime $I_{ON}$, threshold voltage VT, leakage current $I_{OFF}$ (in logarithmic gain), and maximum voltage VDDmax are presented in the table of FIG. 3 for each transistor CMOS_IO, CMOS_HV and CMOS_TN, CMOS_TN_W.

The percentage additional cost AddCt needed to integrate the fabrication of each transistor into a process making provision for a fabrication of at least one high-voltage transistor and of at least one floating-gate transistor is also presented in the table of FIG. 3.

The method of fabricating the high-voltage transistors (CMOS_HV) and of the floating-gate transistors (FGT) will be described below with reference to FIGS. 5 to 14.

For the conventional transistor CMOS_HV, the thickness of the gate dielectric of which is 15 nm, the current in saturated regime $I_{ON}$ is 264 µA/µm, the threshold voltage VT is 0.64 V, the gain of the leakage current $I_{OFF}$ is −11.5 log(A/µm), the maximum voltage VDDmax is 5.5 V, and its integration has a zero additional cost: AddCt of 0%.

The results presented for the conventional high-voltage transistor CMOS_HV correspond to an application of this transistor under medium-voltage conditions, with a maximum supply voltage of 5.5 V.

This is the case for one technology example; in other cases, a conventional high-voltage transistor CMOS_HV may be used at lower voltage if no other alternative is present.

For the conventional transistor CMOS_IO, the thickness of the gate dielectric of which is 5 nm, the current in saturated regime $I_{ON}$ is 550 µA/µm, the threshold voltage VT is 0.5 V, the gain of the leakage current $I_{OFF}$ is −12.4 log(A/µm), the maximum voltage VDDmax is 3.6 V, and its integration has a high additional cost: AddCt of 3%. The high integration cost of the conventional transistor CMOS_IO is in particular due to the fact that the formation of the gate-oxide layer of 5 nm is specifically dedicated thereto. Furthermore, four implanting steps subsequent to the formation of the gate-oxide layer of 5 nm are specifically dedicated to the integration of the transistor CMOS_IO.

For the transistor CMOS_TN, the gate dielectric of which is of the same nature and of the same thickness of 8.7 nm as the tunnel dielectric, the current in saturated regime $I_{ON}$ is 482 µA/µm, the threshold voltage VT is 0.26 V, the gain of the leakage current $I_{OFF}$ is −9.5 log(A/µm), the maximum voltage VDDmax is substantially 4 V, and its integration has a zero additional cost: AddCt of 0%.

For the transistor CMOS_TN_W, the gate dielectric of which is of the same nature and of the same thickness of 8.7 nm as the tunnel dielectric, and which benefits from a formation of a dedicated well, the current in saturated regime $I_{ON}$ is 416 µA/µm, the threshold voltage VT is 0.46 V, the gain of the leakage current $I_{OFF}$ is −11.5 log(A/µm), the maximum voltage VDDmax is substantially 4 V, and its integration has a slight additional cost: AddCt of 1%. The additional cost of the transistor CMOS_TN_W results from the implantation dedicated to the formation of its semiconductor well.

Thus, in summary, the conventional transistor CMOS_HV has the advantage of being of zero cost and of having a high maximum voltage, but has the drawback of being slow and of having a high threshold voltage for a low current in saturated regime.

The conventional transistor CMOS_IO for its part has the advantage of being fast with a quite low threshold voltage for a high current in saturated regime, but has the drawback of being very expensive and of having a low maximum voltage.

Of course, the terms high, low, fast and slow are to be considered relatively with respect to the other values presented in the comparative table of FIG. 3 alone.

The transistor CMOS_TN has the advantages of being fast with a low threshold voltage and a high current in saturated regime, of being of zero cost and of having a quite high maximum voltage. The only drawback of the transistor CMOS_TN is that it has a higher leakage-current gain and, for certain applications, a threshold voltage that is too low (this, for other applications, possibly being an advantage).

For its part, all the characteristics of the transistor CMOS_TN_W are advantageous, since it is fast with a low threshold voltage and a high current in saturated regime, has a quite high maximum voltage, has an acceptable leakage-current gain, and is capable of being integrated at a very low additional cost (three times less expensive than the conventional transistor CMOS_IO).

In comparison with the conventional transistors CMOS_HV, the transistor CMOS_TN_W displays an improvement of about 60% in the current in saturated regime Ion, for a threshold voltage lower by 18 mV, and for the same gain of the leakage current Ioff.

Moreover, in the CMOS_TN and CMOS_TN_W embodiments, the decrease in the gate-oxide thickness (with respect to the conventional CMOS_HV transistor) allows better electrostatic control and better management of drain-induced barrier lowering (DIBL) to be achieved.

In other words, apart from being of zero cost or very inexpensive, the CMOS_TN and CMOS_TN_W embodiments on the whole deliver a better performance.

Thus, it is advantageous to replace all the conventional embodiments of transistors CMOS_IO, CMOS_5V with embodiments of CMOS_TN or CMOS_TN_W transistors.

Reference is now made to FIG. 4.

FIG. 4 shows a transistor TDD of the remote-drain type, comprising a source electrode S, a gate electrode G, and a drain electrode D.

A source region N+ is highly doped with a conductivity type opposite to the conductivity of the well or substrate PWHV in and on which the transistor TDD is formed.

A drain region NWHV is formed by a doped well of the conductivity type opposite to the conductivity of the substrate PWHV.

A lateral isolating region STI allows the drain electrode D to be moved away from the gate region G.

The gate region comprises a conductive strip P1 and a gate-dielectric layer TN. The gate region rests on a channel region Lg of the substrate PWHV between the source region N+ and the drain region NWHV, and on a zone of overlap Lrcvr of the drain region NWHV.

The remote-drain transistor TDD is configured to allow medium-voltage control and to withstand high voltages on its drain.

The well PWHV and the drain region NWHV are to this end doped with concentrations configured to withstand high voltages.

Conventionally, the fabrication of remote-drain transistors uses dedicated fabricating steps, in particular for the formation of the gate-oxide layer, which may optionally be carried out conjointly with the production of the gate-oxide layer of conventional first medium-voltage transistors CMOS_IO, of thickness comprised between 4 nm and 6 nm (such as described above with reference to FIG. 1).

However, in the advantageous example illustrated in FIG. 4, the production of the remote-drain transistor TDD results from an implementation of a process in which the formation of the tunnel-dielectric layer of a floating-gate transistor FGT simultaneously forms the gate-dielectric layer TN of the remote-drain transistor TDD. Likewise, the floating-gate regions and the gate region P1 of the remote-drain transistor are formed in a common step.

Thus, the gate structure PO134 of the remote-drain transistor TDD is identical (in nature and in thickness) to the floating-gate structure PO130 of the floating-gate transistor.

In addition, the floating-gate transistor FGT comprises a control-gate structure PO230 superposed on the floating-gate structure PO130.

In other words, the gate-dielectric layer TN of the remote-drain transistor TDD has the same nature and has the same thickness as the tunnel-dielectric layer, and the gate region P1 of the remote-drain transistor TDD has the same nature and has the same thickness as the floating-gate region.

This embodiment thus allows remote-drain transistors TDD to be integrated at zero cost into any fabricating process making provision to produce a floating-gate transistor FGT.

FIGS. 5 to 14 illustrate respective steps of a process for fabricating an integrated circuit.

Figure 14:
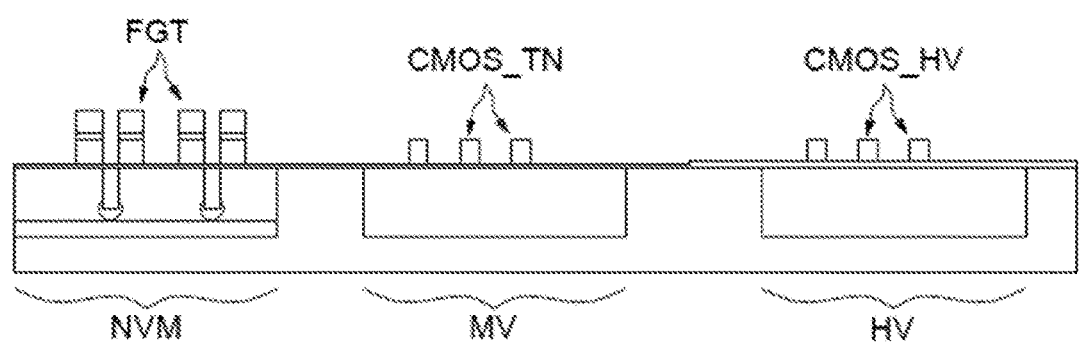

The process comprises a fabrication of at least one medium-voltage transistor CMOS_TN (FIG. 14) configured to operate at a supply voltage comprised between 1.8 V and 5 V, a fabrication of at least one floating-gate transistor FGT (FIG. 14), and a fabrication of at least one high-voltage transistor CMOS_HV (FIG. 14).

FIG. 5 shows a semiconductor substrate SUB with which the fabrication of the integrated circuit is implemented.

The floating-gate transistor is fabricated in a memory portion NVM of the substrate SUB. The medium-voltage transistor is fabricated in a so-called medium-voltage portion MV of the substrate SUB and the high-voltage transistor is fabricated in a so-called high-voltage portion HV of the substrate SUB.

A buried source region NISO has been implanted at depth in the memory portion NVM.

Figure 6:
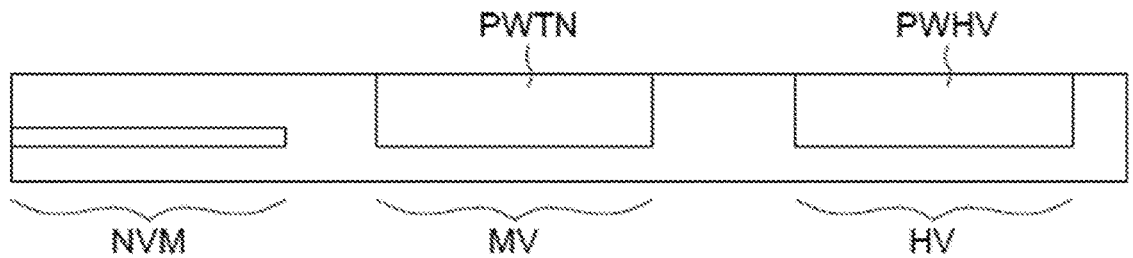

FIG. 6 illustrates the result of a step of implanting high-voltage wells PWTN, PWHV in the high-voltage portion HV and optionally in the medium-voltage portion MV of the substrate.

The high-voltage wells PWHV are formed with a dopant concentration configured for operation at voltages higher than 10 V.

In this eventuality, the fabricating process may result in a medium-voltage transistor CMOS_TN such as described above with reference to the medium-voltage transistor CMOS_TN of FIG. 3.

According to one advantageous alternative, the implantation of the well PWTN into the medium-voltage portion MV comprises an implantation of dopants in a concentration configured to adjust, to a desired value, the threshold voltage of the (future) medium-voltage transistor. For example, the concentration of the dopants is configured to adjust the threshold value of the medium-voltage transistor CMOS_TN_W such as described above with reference to the medium-voltage transistor CMOS_TN_W of FIG. 3.

Figure 7:
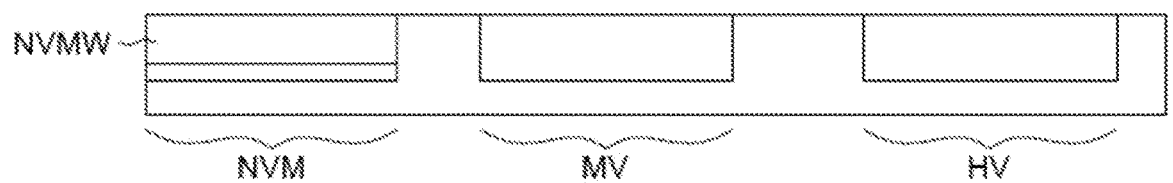

FIG. 7 illustrates the result of an implantation of the well NVMW in the memory portion NVM.

Figure 8:
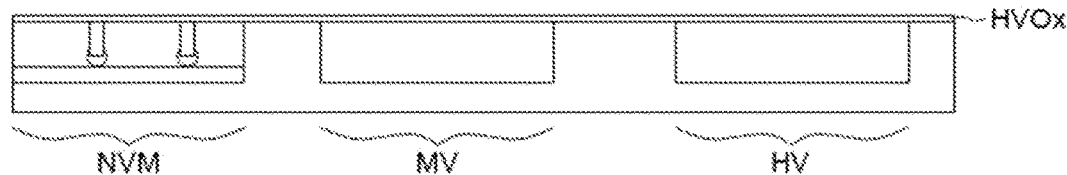

FIG. 8 illustrates the result of a step of forming elements in the memory portion NVM, for example vertical gates VG of buried transistors, and of a step of forming a so-called high-voltage oxide layer HVOx, on all the upper surface of the substrate SUB.

The high-voltage oxide layer HVOx, for example, has a thickness of 15 nm, and may be formed by thermal growth.

Specifically, growth-based forming techniques lead to more robust structures than deposition-based forming techniques.

Thus, the robustness of the tunnel oxide TNOx that will result therefrom (see the step described with reference to FIG. 9 below) allows reliable operation in a voltage range from 1.8 V to 4 V, or even 5 V.

Figure 9:
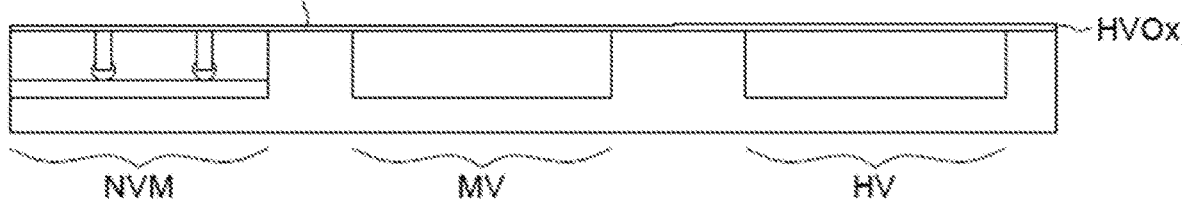

FIG. 9 illustrates the result of a step of defining a tunnel-oxide layer TNOx, comprising an etch of the high-voltage oxide layer HVOx to a so-called tunnel thickness comprised between 7 nm and 10 nm, preferably between 8 nm and 9.5 nm, and for example of 8.7 nm.

The thickness and the nature of the tunnel-oxide layer TNOx are, for example, configured to allow transfer of charge via the Fowler-Nordheim effect at voltages higher than 10 V, for the floating-gate transistors.

The tunnel-oxide layer TNOx is defined in the memory region NVM and in the medium-voltage region MV, but not in the high-voltage region HV, and thus there is a difference in thickness of the layer HVOx in the region HV as compared to the regions MV and NVM.

Figure 10:
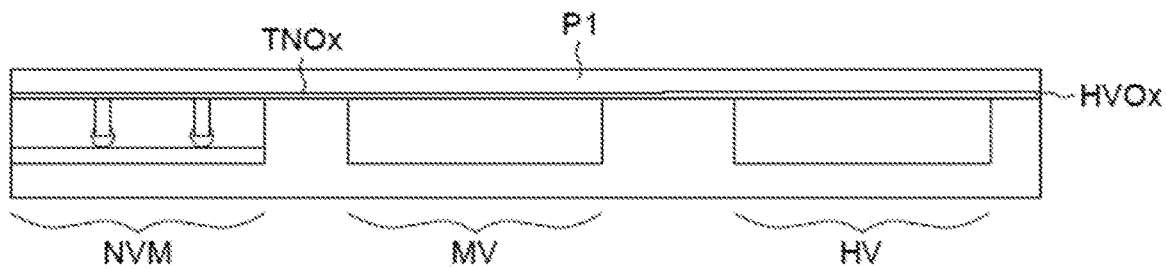

FIG. 10 illustrates the result of a step of depositing a conductive layer P1 made of conductive doped polysilicon, covering all the substrate SUB, in particular the high-voltage oxide layer HVOx and tunnel-oxide layer TNOx.

Figure 11:
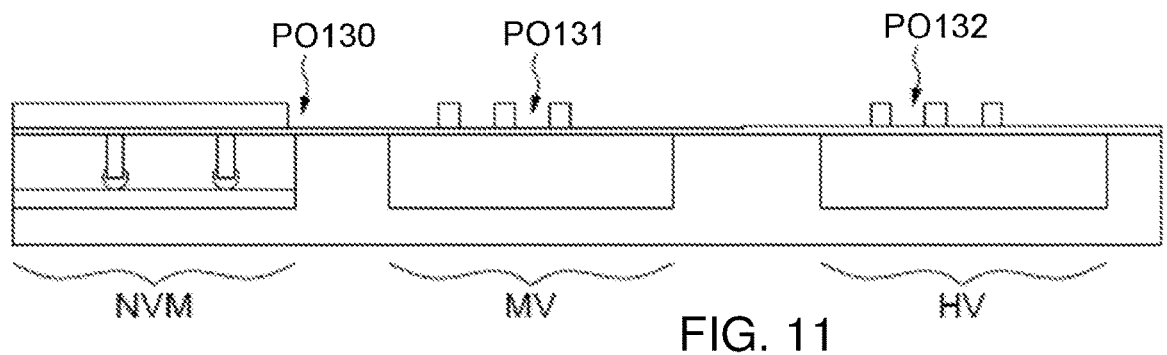

FIG. 11 illustrates the result of a step of defining first gate structures PO130, PO131, PO132 from the layer P1.

The gate structures each comprise a gate region P1 (FIG. 10) and a gate-dielectric layer TNOx (FIG. 9), HVOx (FIG. 8) and are intended to form:
  floating-gate structures PO130 of the floating-gate transistors,
  gate structures PO131 of the medium-voltage transistors and
  gate structures PO132 of the high-voltage transistors.

In this step, the gate structures PO130 of the floating-gate transistors have not yet been separated and take the form of a common strip.

Figure 12:
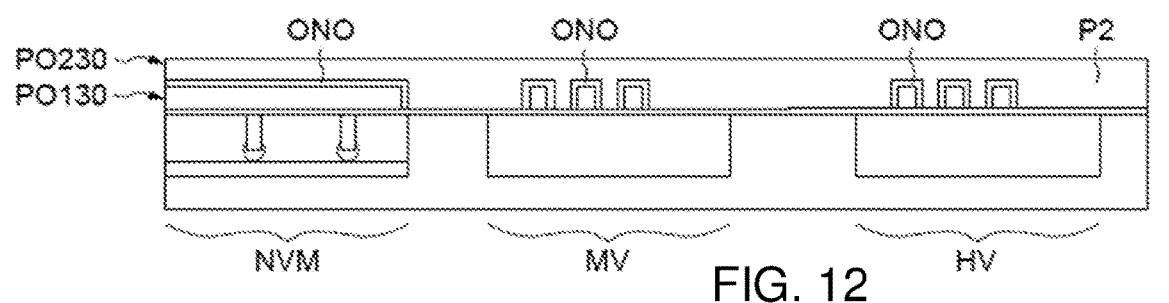

FIG. 12 illustrates the result of a step of forming a dielectric-layer stack ONO of the silicon oxide-nitride-oxide type, and of depositing a second conductive layer P2 made of conductive doped polysilicon. Thus, a future control-gate structure PO230 covers all the substrate SUB, and in particular the future floating-gate structures PO130.

Figure 13:
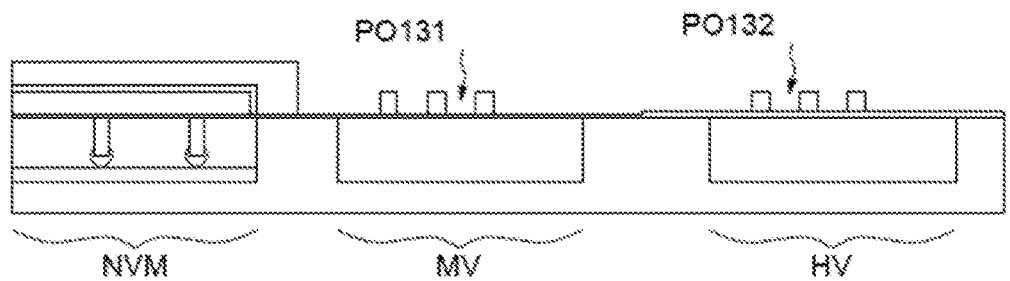

FIG. 13 illustrates the result of a first step of defining the second gate regions, and comprises removing the second conductive layer P2 and the stack ONO, in the medium-voltage region MV and in the high-voltage region HV, uncovering the gate structures PO131, PO132 of the future medium-voltage and high-voltage transistors.

FIG. 14 shows a step of defining floating-gate transistors FGT, comprising the etch of the second conductive layer P2, of the stack ONO and of the first conductive layer P1.

In this example, the etch is designed so as to form two floating-gate transistors FGT on either side of each buried vertical-gate transistor in the memory portion NVM.

This construction of the memory portion NVM, which is given by way of purely illustrative and completely non-limiting example, nevertheless allows both the high-voltage transistors CMOS_HV and the medium-voltage transistors CMOS_TN to be manufactured at zero cost.

Other processes for fabricating floating-gate transistors may of course allow production at zero cost of a medium-voltage transistor CMOS_TN, providing that said fabrications of the medium-voltage transistor CMOS_TN and of the floating-gate transistor FGT comprise a common step of forming a dielectric layer, which is configured to form a tunnel-dielectric layer of the floating-gate transistor FGT, and to form a gate-dielectric layer of the medium-voltage transistor CMOS_TN.

The invention claimed is:

1. A process for fabricating an integrated circuit, comprising:
  fabricating a first transistor configured to operate under a first supply voltage; and
  fabricating a floating-gate transistor;
  wherein fabricating the first transistor and fabricating the floating-gate transistor utilize a common fabrication step of forming a dielectric layer, wherein said dielectric layer is configured to:
    form a tunnel-dielectric layer of the floating-gate transistor that will allow transfer of charge via the Fowler-Nordheim effect at a second voltage that is higher than the first supply voltage; and
    form a gate-dielectric layer of the first transistor.

2. The process according to claim 1, wherein fabricating the first transistor and fabricating the floating-gate transistor utilize a further common fabrication step of forming a conductive layer over the dielectric layer, wherein said conductive layer is configured to:
  form a floating gate region of the floating-gate transistor; and
  form a gate region of the first transistor.

3. The process according to claim 2, further comprising fabricating a remote-drain transistor, wherein the common fabrication step of forming the dielectric layer is further configured to form a gate-dielectric layer of the remote-drain transistor.

4. The process according to claim 3, wherein the common fabrication step of forming the conductive layer is configured to form a gate region of the remote-drain transistor.

5. The process according to claim 1, wherein the common fabrication step of forming the dielectric layer comprises thermally growing a silicon-oxide layer and performing an etch of the silicon-oxide layer to a thickness comprised between 7 nm and 10 nm.

6. The process according to claim 5, wherein the thickness is between 8 nm and 9.5 nm.

7. The process according to claim 1, wherein fabricating the first transistor comprises forming a semiconductor well by implanting dopants in a concentration configured to adjust, to a desired value, a threshold voltage of the first transistor, wherein the first transistor is fabricated on said semiconductor well.

8. The process according to claim 1, wherein the first supply voltage is comprised between 1.8 V and 5 V, and the second voltage is higher than 10 V.

9. The process according to claim 1, further comprising fabricating a high voltage transistor, wherein the common fabrication step of forming the dielectric layer is further configured to form a gate-dielectric layer of the high voltage transistor; said common fabrication step of forming the dielectric layer comprising the steps of:
  forming the dielectric layer having a first thickness; and
  in a region where the first transistor and floating gate transistor are located, reducing a thickness of the dielectric layer from the first thickness to a second thickness, and wherein reducing is not performed in a region where the high voltage transistor is located.

10. The process according to claim 9, wherein fabricating the first transistor, fabricating the floating-gate transistor and fabricating the high voltage transistor utilize a further common fabrication step of forming a conductive layer over the dielectric layer, wherein said conductive layer is configured to:
  form a floating gate region of the floating-gate transistor;
  form a gate region of the first transistor; and
  for a gate region of the high voltage transistor.

11. An integrated circuit, comprising:
  a first transistor configured to operate under a first supply voltage, wherein said first transistor includes a gate-dielectric layer; and
  a floating-gate transistor including a tunnel-dielectric layer configured to allow transfer of charge via the Fowler-Nordheim effect at a second voltage higher than the first supply voltage;
  wherein the gate-dielectric layer of the first transistor has a same nature and has a same thickness as the tunnel-dielectric layer of the floating-gate transistor.

12. The integrated circuit according to claim 11, wherein the first transistor comprises a gate region, and wherein the floating-gate transistor comprises a floating-gate region, and wherein the gate region of the first transistor has a same nature and a same thickness as the floating-gate region of the floating-gate transistor.

13. The integrated circuit according claim 11, further comprising a remote-drain transistor comprising a dielectric layer and a gate region partially covering a drain region, wherein the dielectric layer of the remote-drain transistor has the same nature and the same thickness as the tunnel-dielectric layer of the floating-gate transistor.

14. The integrated circuit according to claim 13:
wherein the first transistor comprises a gate region, and wherein the floating-gate transistor comprises a floating-gate region, and wherein the gate region of the first transistor has a same nature and a same thickness as the floating-gate region of the floating-gate transistor; and
wherein the gate region of the remote-drain transistor has the same nature and has the same thickness as the floating-gate region of the floating-gate transistor.

15. The integrated circuit according to claim 11, wherein the nature of the tunnel-dielectric layer is a silicon oxide, and wherein the thickness of the tunnel-dielectric layer is between 7 nm and 10 nm.

16. The integrated circuit according to claim 15, wherein the thickness is between 8 nm and 9.5 nm.

17. The integrated circuit according claim 11, wherein the first transistor is formed on a semiconductor well implanted using dopants in a concentration configured to adjust, to a desired value, the threshold voltage of the first transistor.

18. The integrated circuit according claim 11, wherein the first supply voltage is comprised between 1.8 V and 5 V and the second voltage is higher than 10 V.

19. The integrated circuit according claim 11, further comprising:
a high voltage transistor configured to operate under a high supply voltage, wherein said high voltage transistor includes a further gate-dielectric layer; and
wherein the further gate-dielectric layer of the high voltage transistor has a same nature as the gate-dielectric layer of the first transistor and the tunnel-dielectric layer of the floating-gate transistor, but where the further gate-dielectric layer has a thickness that is larger than a thickness of gate-dielectric layer of the first transistor and the tunnel-dielectric layer of the floating-gate transistor.

20. The integrated circuit according to claim 19:
wherein the first transistor comprises a gate region, and wherein the floating-gate transistor comprises a floating-gate region, wherein the high voltage transistor comprises a further gate region, and wherein the gate region of the first transistor, the floating-gate region of the floating-gate transistor and the further gate region of the high voltage transistor have a same nature and a same thickness.

* * * * *